United States Patent [19]
Kobayashi

[11] Patent Number: 5,982,212
[45] Date of Patent: Nov. 9, 1999

[54] DELAY DIFFERENCE ADJUSTMENT CIRCUIT AND PHASE ADJUSTER

[75] Inventor: Naoki Kobayashi, Tokyo, Japan

[73] Assignee: NEC Corporation, Tokyo, Japan

[21] Appl. No.: 08/985,780

[22] Filed: Dec. 5, 1997

[30] Foreign Application Priority Data

Dec. 6, 1996 [JP] Japan ................................. 8-342590

[51] Int. Cl.[6] ..................................................... H03K 5/13
[52] U.S. Cl. .......................... 327/262; 327/236; 327/244; 327/158; 327/292
[58] Field of Search ..................................... 327/261, 262, 327/284, 233–236, 243–244, 155, 158, 161, 292, 3, 7, 269, 270, 271

[56] References Cited

U.S. PATENT DOCUMENTS

| | | | |
|---|---|---|---|
| 5,631,591 | 5/1997 | Bar-Niv | 327/158 |
| 5,812,626 | 9/1998 | Kusumoto et al. | 327/20 |

FOREIGN PATENT DOCUMENTS

| | | |
|---|---|---|
| 0 173 521 A2 | 3/1986 | European Pat. Off. . |
| 0 499 174 A1 | 8/1992 | European Pat. Off. . |

OTHER PUBLICATIONS

Patent Abstracts of Japan, 61209370, Sep. 17, 1986, "Skew Correction System.."
Patent Abstracts of Japan, 08088622, Apr. 2, 1996, "Delay Difference Absorbing System."
Patent Abstracts of Japan, 57192133, Nov. 26, 1982, "Automatic Adjusting Device for Skew/Delay."

*Primary Examiner*—Timothy P. Callahan
*Assistant Examiner*—Eunja Shin
*Attorney, Agent, or Firm*—Whitham, Curtis & Whitham

[57] ABSTRACT

There is provided an adjustment circuit which delays a first and a second signal by a desired delay. After the first and the second signal are inputted to the adjustment circuit via a first and a second signal line, respectively, the first and the second signal are exchanged and are inputted via the second and the first signal line, respectively. A detection circuit receives the first and the second signal from the adjustment circuit, and detects the phase differences of these signals, before and after the exchange. The holding circuit holds a first phase difference detected by the detection circuit before the exchange, and holds a second phase difference detected by the detection circuit after the exchange. When the holding circuit holds the first and the second phase difference, a comparison circuit compares these phase differences. A counter counts in accordance with the comparison results of the comparison circuit, and sets the desired delay of the adjustment circuit.

8 Claims, 5 Drawing Sheets

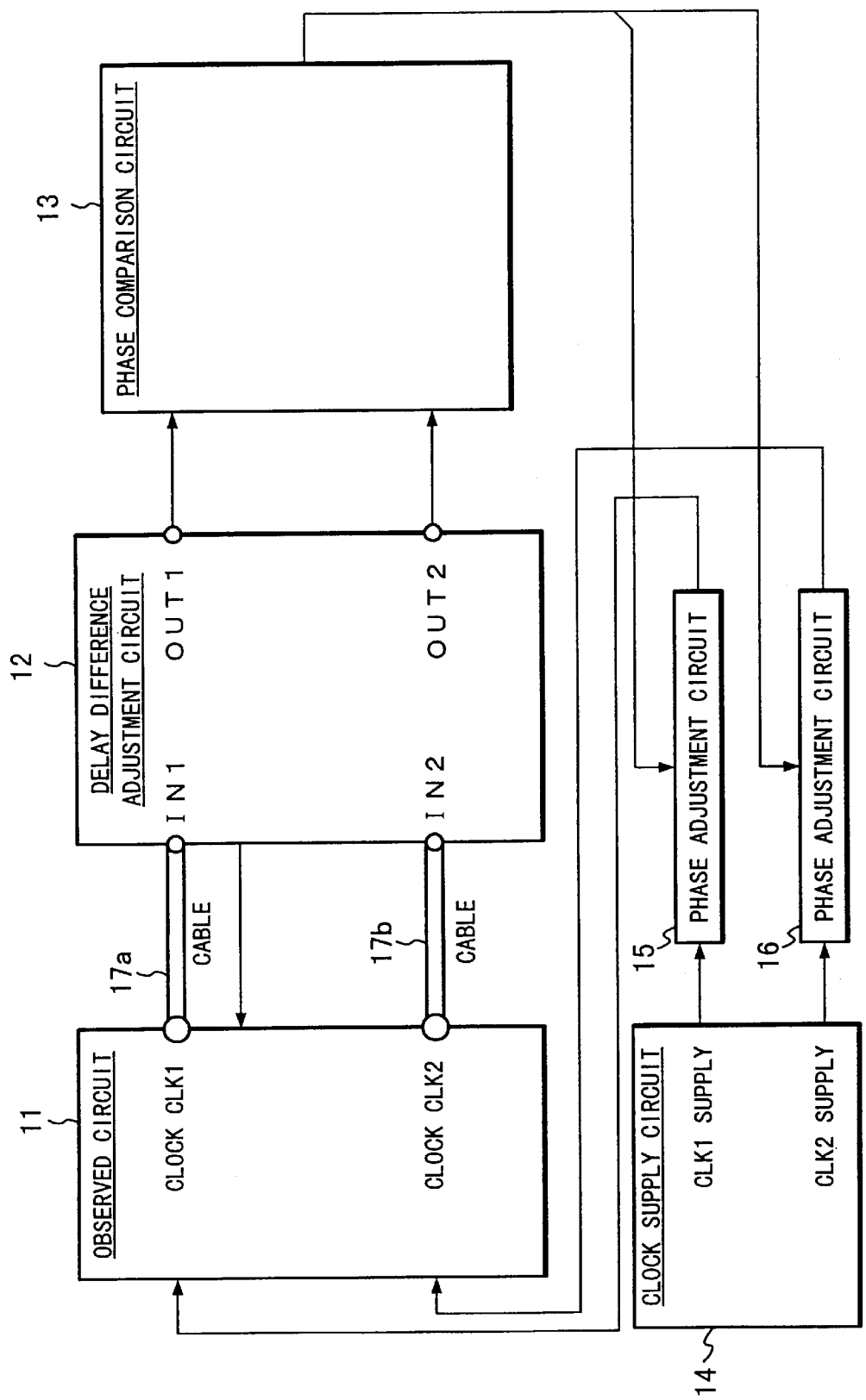
F I G. 1

DELAY DIFFERENCE ADJUSTMENT CIRCUIT AND PHASE ADJUSTER

BACKGROUND OF THE INVENTION

The present invention relates to a delay difference adjustment circuit and a phase adjuster, more particularly, to a delay difference adjustment circuit which adjusts the delay difference between delays of two signal lines (hereinafter referred to as "the delay difference") through which the two signals are transmitted, and to a phase adjuster which adjusts the phase difference between the two signals.

When the phase difference between the two clock signals flowing in a circuit is measured, each of the clock signals has been measured by a measuring instrument such as an oscilloscope by inputting them via two cables. Since the delay difference always exists even if the lengths of the two cables are equal, it is necessary to adjust the delay difference.

Referring to FIG. 5, the conventional device which adjusts the delay difference includes an observed circuit 41 which has clock signals CLK41 and CLK42 as the objects of observation, the measuring instrument 42, a variable delay circuit 43 which is located inside the measuring instrument 42 and delaying the clock signal inputted from the input IN42 by the delay amount, cables 45a and 45b. Each of the cables 45a and 45b connects the observed circuit 41 and the measuring instrument 42. When an observer supplies the clocks CLK41 and CLK42 to the measuring instrument 42 via the two cables 45a and 45b and measures these phase differences by the measuring instrument 42, firstly, the clock signals CLK41 and CLK42 are inputted to an input IN41 and IN42 of the measuring instrument 42, respectively. At that time, the display circuit 44 of the measuring instrument 42 indicates an apparent phase difference as the waveform or a phase difference, and the apparent phase is stored. Next, the observer exchanges the cables 45a and 45b. The clock signal CLK41 is inputted to the input IN42 through the cable 45b and the clock signal CLK42 is inputted to the input IN41 through the cable 45b. The next apparent phase difference is displayed in the display circuit 44 and is compared with the apparent phase difference which has been previously stored. The observer adjusts the delay amount of a variable delay circuit 43, by supplying a direction for delay amount setting to the input IN43 from the outside of the measuring instrument 42.

The conventional device, as described above, which adjusts the delay difference has had the problem that all of the operations had to be made manually to adjust the delay difference between the two clock signals which are observed via the two cables. More specifically, the observer has to perform all of a series of operations, including storing the phase differences of the two clock signals, exchanging the two cables, comparing the phase differences, and adjusting the delay amounts. Therefore, it takes inordinately amount of labor and time to adjust the delay difference.

Furthermore, since the above-mentioned conventional device is not capable of automatically adjusting the delay difference between the two cables, the phase adjustment of the clocks could not be made automatically.

SUMMARY OF THE INVENTION

It is an object of the present invention to provide a delay difference adjustment circuit which is capable of adjusting the delay difference of clock cables without manual operations.

In addition, it is another object of the present invention to provide a phase adjuster which automatically adjusts the delay difference of the two clock cables, thereby making full automatic phase adjustment of the clocks possible.

According to an aspect of the present invention, there is provided a circuit for adjusting the difference between delays of a first and a second signal line through which a first and a second signal are transmitted, said circuit comprising an adjustment circuit for receiving the first and the second signal through said first and said second signal line, and for delaying the first and the second signal by desired delay, a detection circuit for receiving the first and the second signal from said adjustment circuit, and for detecting a phase difference between these signals, a holding circuit for holding a first phase difference detected by said detection circuit when the first and the second signal transmit said first and said second signal line, respectively, and for holding a second phase difference detected by said detection circuit when the first and the second signal transmit said second and said first signal line, respectively, a comparison circuit for comparing said first and said second phase difference and a counter for counting in response to the comparison result of said comparison circuit and for setting said desired delay of said adjustment circuit.

BRIEF DESCRIPTION OF DRAWINGS

Other features and advantages of the invention will be made more apparent by the detailed description hereunder taken in conjunction with the accompanying drawings, wherein:

FIG. 1 shows the configuration of the embodiments of the present invention;

In the drawings, the same reference numerals represent the same structural elements.

DETAILED DESCRIPTION OF THE PREFERRED EMBODIMENTS

Figure 2:
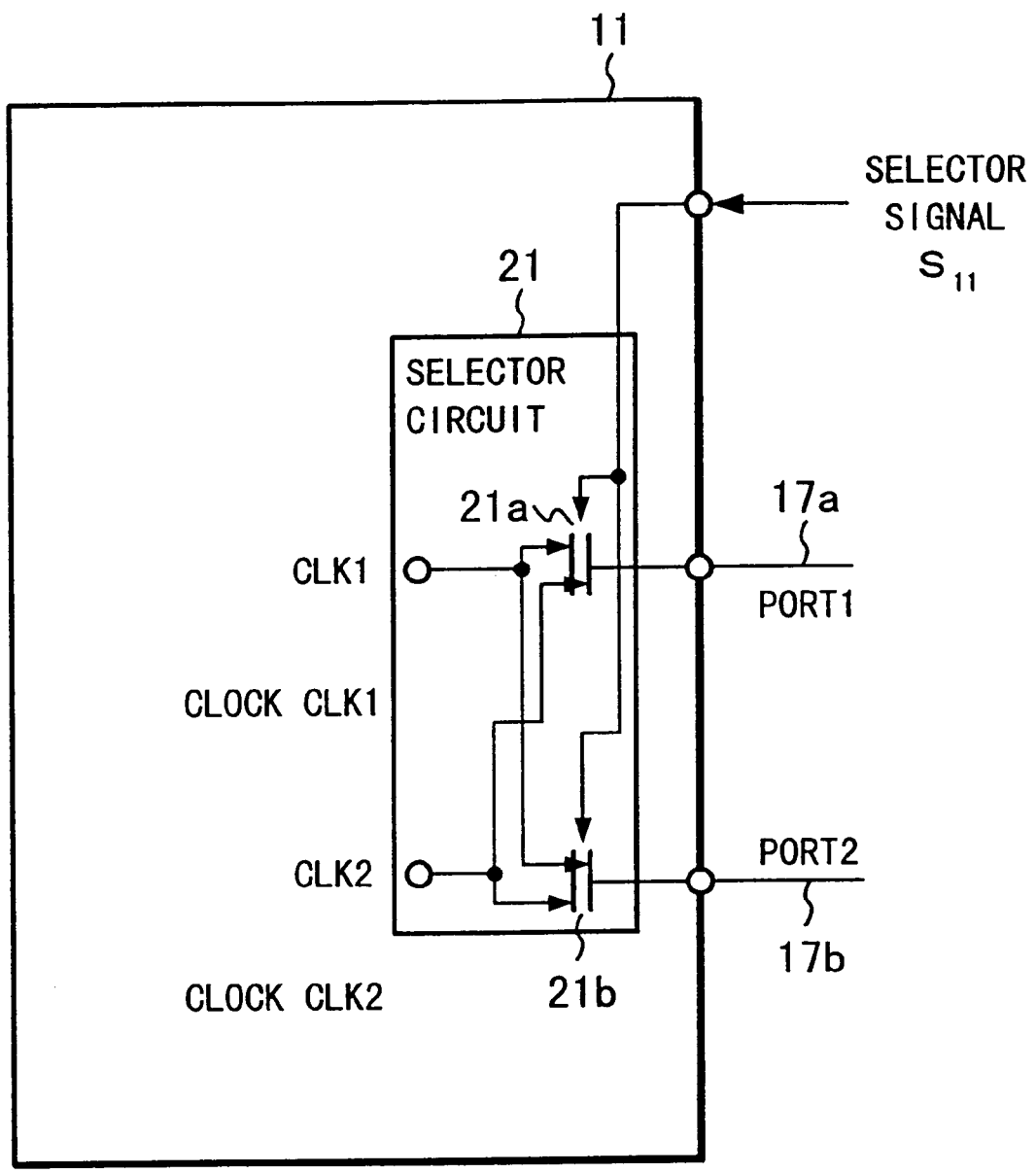
FIG. 2 shows the configuration of the selector circuit of the present invention.

Next, the present invention will be described in detail with reference to the drawings.

Referring to FIG. 1, the first embodiment of the phase adjuster of the present invention includes a delay difference adjustment circuit 12, a phase comparison circuit 13, a clock supply circuit 14, a phase adjustment circuit 15 and 16. The delay difference adjustment circuit 12 is connected to the observed circuit 11 by the cables 17a and 17b The delay difference adjustment circuit 12 automatically adjusts the delay differences between the two cables 17a and 17b. The two cables 17a and 17b are connected to the clock signals CLK1 and CLK2, respectively, which are the observation points of the observed circuit 11. The phase comparison circuit 13 compares the phases of the clock signals CLK1 and CLK2 which are transmitted by the delay difference adjustment circuit 12. The true phases of the clock signals CLK1 and CLK2 are compared by the phase comparison circuit, because both the clock signals CLK1 and CLK2 have no delay elements caused by the difference between delays of the cables 17a and 17b. The clock supply circuit 14 supplies the clock signals CLK1 and CLK2 to the observed circuit 11. The phase adjustment circuits 15 and 16 adjust the phases of the clock signals CLK1 and CLK2, respectively. The cable 17a has one end connected to an output port PORT1 and the other end connected to an input terminal IN1 of the delay difference adjustment circuit 12. The cable 17b has one end connected to an output port PORT2 and the other end connected to an input terminal IN2 of the delay difference adjustment circuit 12.

Referring to FIG. 2, the observed circuit 11 comprises an selector circuit 21. The clock signals CLK1 and CLK2, which are signals to be observed, are inputted to the selector circuit 21. The selector circuit 21 outputs the clock signals CLK1 and CLK2 through the output port PORT1 and PORT2. The output ports PORT1 and PORT2 of the observed circuit 11 are connected to the cables 17a and 17b, respectively. The selector circuit 21 exchanges the cables 17 to which each of the clock signals CLK1 and CLK2 are outputted in accordance with a selector signal S11 that is received from the delay difference adjustment circuit 12, and outputs the clock signals CLK1 and CLK2 to the delay difference adjustment circuit 12. The selector circuit 21 includes a selector 21a and 21b. The selector 21a selects and outputs the clock signal CLK1 to the output port PORT1 when the selector signal S11 is "0", and selects and outputs the clock signal CLK2 to the output port PORT1 when the selector signal S11 is "1". The selector 21b selects and outputs the clock signal CLK2 to the output port PORT2 when the selector signal S11 is "0", and selects and outputs the clock signal CLK1 to the output port PORT2 when the selector signal S11 is "1".

Figure 3:
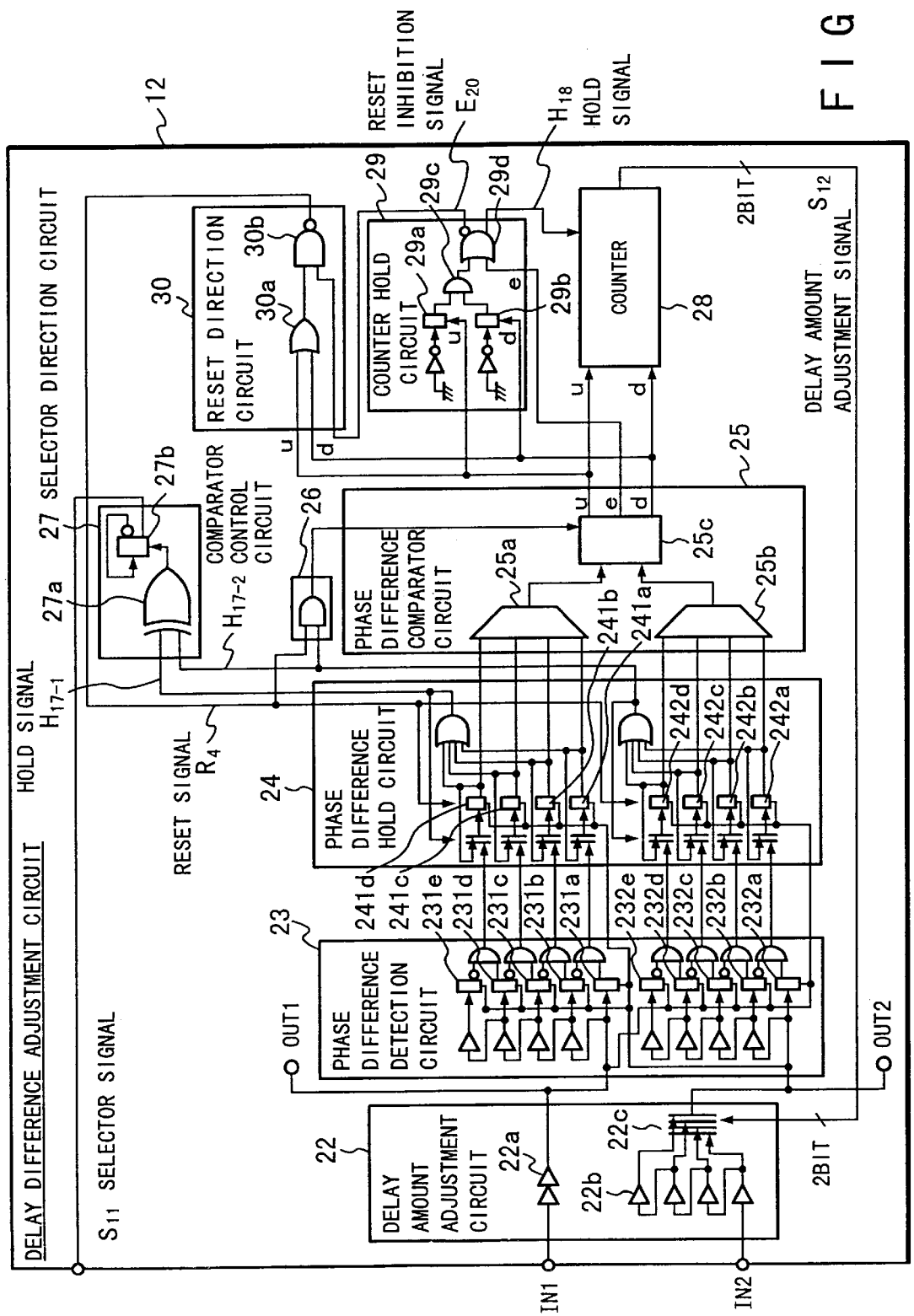
FIG. 3 shows the configuration of the delay difference adjustment circuit of the present invention.

Referring to FIG. 3, the delay difference adjustment circuit 12 comprises a delay amount adjustment circuit 22, a phase difference detection circuit 23, a phase difference hold circuit 24, a phase difference comparison circuit 25, a comparator control circuit 26, a selector direction circuit 27, a counter 28, a counter hold circuit 29, a reset direction circuit 30. The delay difference adjustment circuit 12 have input terminals IN1 and IN2 to which the cables 17a and 17b are connected, and output terminals OUT1 and OUT2 which output the clock signal CLK1 or CLK2 that have been adjusted the delay difference.

The delay amount adjustment circuit 22 adjusts the delay amount of either one or both of the two clock signals CLK1 and CLK2, in accordance with a delay amount adjustment signal S12. The phase difference detection circuit 23 detects the phase difference of the two clocks which the delay amount adjustment circuit 22 outputs. The phase difference hold circuit 24 holds the detection results which the phase difference detection circuit 23 outputs. The above detection results include two results of the phase difference detection detected by the phase difference detection circuit 23 before and after the exchange of the two clock transmission paths, namely, the cables 17. The phase difference comparison circuit 25 compares the results of the two detection results which the phase difference hold circuit 24 holds. That is, the phase difference comparison circuit 25 compares the phase difference detection results before and after the exchange of the transmission cables 17 of the two clock signals. The phase difference comparison circuit 25 gives directions to count up, count down or hold the counted value of the counter 28 in accordance with the comparison result, which decides the delay amount of the delay amount adjustment circuit 22. The comparator control circuit 26 inhibits the counter 28 from varying its counted value unless the phase difference hold circuit 24 holds the two results of the phase difference detection detected by the phase difference detection circuit 23 before and after the exchange of the cables 17 of the clock signals CLK1 and CLK2. The selector direction circuit 27 outputs the selector signal S11 which directs the selector circuit 21 to exchange the signals which transmit on cables 17 by changing its value from "0" to "1" or from "1" to "0", when the phase difference hold circuit 24 holds only one of the results of the phase difference detection detected by the phase difference detection circuit 23. The counter 28 varies the counted value, in accordance with the count up or count down direction signals which the phase difference comparison circuit 25 outputs, and outputs the counted value as a delay amount adjustment signal S12. The counter hold circuit 29 inputs the results of the phase difference comparison which the phase difference comparison circuit 25 outputs. The counter hold circuit directs the counter 28 to hold the counted value and inhibits the phase difference hold circuit 24 from clearing the holding results, when the phase differences becomes equal or substantially equal and after the combination of two clock signals and the cables is changed. The reset direction circuit 30 gets the comparison results from the phase difference comparator circuit 25. The reset direction circuit 30 outputs a reset signal R4 which makes the entire holding values of the phase difference hold circuit 24 to to "0", when the comparison result by the phase difference comparator circuit 25 indicates the phase differences are neither equal nor substantially equal and an additional phase comparison is needed after making the variation in the counter 28, i.e., after the delay amount adjustment circuit 22 has adjusted the delay amount.

Next, a specific configuration of the above-described delay difference adjustment circuit 12 will be explained.

Referring to FIG. 3, the delay amount adjustment circuit 22 includes a two-stage fixed delay gate 22a which outputs to the output terminal OUT1, a delay gate 22b which is variable from stage 1 to stage 4, and a selector 22c which outputs to the output terminal OUT2. The selector 22c switches the number of stages of the variable delay gate 22b in accordance with the two-bit delay amount adjustment signal S12. The phase difference detection circuit 23 has flip-flops (hereinafter referred to as "FFs") 231a–231e and FFs 232a–232d. The FFs 231a–231e receive a plurality of signals each of which gradually delayed by 5 stages of delay gates, 0th stage to 4th stage, from the one clock signal outputted to the output OUT1, and hold the signals when the other clock signal outputted to the output OUT2 rises. The FFs 232a–232e receive a plurality of signals each of which gradually delayed by 5 stages of delay gates, 0th stage to 4th stage, from the one clock signal outputted to the output OUT2, and hold the signals when the other clock signal outputted to the output OUT1 rises. The phase difference hold circuit 24 has FFS 241a–241d and FFs 242a–242d. The FFs 241a–241d receive the logical product value of the FF 231a and the inverted value of the FF 231b, the value of the logical product of the value of the FF 231b and the inverted value of the FF 231c, the value of the logical product of the value of the FF 231c and the inverted value of the FF 231d and the value of the logical product of the value of the FF 231d and the inverted value of the FF 231e, and hold them at the time of the rising edge of the clock signal outputted to the output terminal OUT2. The FFs 242a–242d receive the logical product of the value of the FF 232a and the inverted value of the FF 232b, the value of the logical product of the value of the FF 232b and the inverted value of the FF 232c, the value of the logical product of the value of the FF 232c and the inverted value of the FF 232d and the value of the logical product of the value of FF232d and the inverted value of the FF 232e, and hold them at the time of the rising edge of the signal outputted to the output terminal OUT1. When the phase of the clock signal outputted to the output terminal OUT1 is advanced as compared with the one to the output terminal OUT2, the FFs 241a–241d always hold "1" in at least one of them, output "1" to a hold signal H17-1 and keep holding the held value. When the phase of the clock signal outputted to the output terminal OUT2 is advanced as compared with the one to the output terminal OUT1, the FFs 242a–242d always hold "1" in at least one of them, output "1" to a hold signal H17-2, and keep holding the held value. When the reset signal R4 is "0", the FFs 241a–241d and the FFs 242a–242d clear the holding values to "0".

The phase difference comparison circuit 25 has an encoder 25a which encodes either one of the outputs of FF241a–241d which is taking in "1", an encoder 25b which encodes either one of the outputs of FF242a–242d which is taking in "1", and a comparator 25c which compares the outputs of the encoder 25a and the encoder 25b. When the comparator control circuit 26 outputs "0", the comparator 25c outputs "0" for the signals u, e, and d. When the comparator control circuit 26 outputs "1" and the output value of the encoder 25a is larger than the output value of the encoder 25b, the comparator 25c outputs signals u=1, e=0, and d=0. When the comparator control circuit 26 outputs "1" and the output value of the encoder 25b is larger than the output value of the encoder 25a, the comparator 25c outputs u=0, e=0, and d=1. When the comparator control circuit 26 outputs "1" and the output value of the encoder 25a is equal to the output value of the encoder 25b, the comparator 25c outputs the signals u=0, e=1, and d=0.

The comparator control circuit 26 outputs the logical product of the hold signals H17-1 and H17-2 outputted from the phase difference hold circuit 24. The comparator control circuit 26 outputs "1" to the comparator 25c, only when both the hold signals H17-1 and H17-2 are "1". The selector direction circuit 27 consists of exclusive-OR circuit 27a which takes exclusive logical sum of the hold signals H17-1 and H17-2 and, the FF 27b which inverts the value triggered by the rising edge of the output of Ex-OR circuit 27a and outputs the output of the FF 27b as the input switch direction signal S11. When a hold signal H18 is "0" and the output signals of the comparator 25c are u=1, d=0, the counter 28 counts up. Also, when the output signals are u=0, d=1, the counter 28 counts down, and when the hold signal H18 is "1", the counter holds the counted value. The counter hold circuit 29 inputs the output signals u, e, and d which the comparator 25c outputs. The counter hold circuit 29 has a FF 29a which fetches "1" when the output signal u changes from "0" to "1", a FF 29B which fetches "1" when the output signal d changes from "0" to "1", an AND circuit 29c which outputs logical product of the outputs FF29a and 29B, and an OR circuit 29d which takes logical sum of the output signal e and the output of the AND circuit 29c. The counter hold circuit 29 outputs the output of OR circuit 29d as the hold signal H18 and outputs the inverted output of the OR circuit 29d as a reset inhibition signal E20. The reset direction circuit 30 consists of an OR circuit 30a which outputs logical sum of the output signals u and d outputted from the comparator 25c, and a NAND circuit 30b which outputs the negative logical product of the output of OR circuit 30a and the reset inhibition signal E20. The reset direction circuit outputs the output of the NAND circuit 30b as the reset signal R4.

Next, the outline of the operation of the entire phase adjuster of the embodiments of the present invention will be described.

Referring to FIG. 2, assume that the selector signal S11 is "0" at the time of starting to adjust the delay difference, the selector circuit 21 of the observed circuit 11 outputs the clock signal CLK1 to the output port PORT1. The clock signal CLK1 is inputted to IN1 of the delay difference adjustment circuit 12 via the cable 17a. The selector circuit 21 sends out the clock signal CLK2 to the output port PORT2. The clock signal CLK2 is inputted to IN2 of the delay difference adjustment circuit 12 via the cable 17b.

Figure 4A:
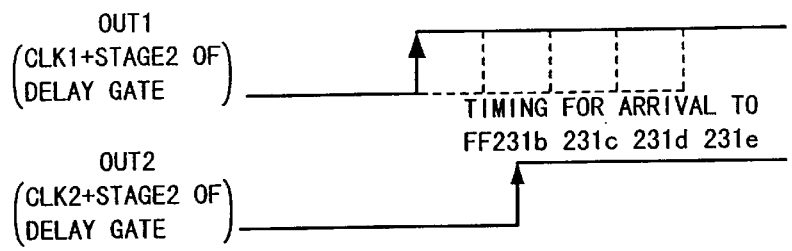
FIGS. 4A–4D are diagrams of waveforms which illustrate the operation of the present invention.

Referring to FIG. 3, the delay difference adjustment circuit 12 outputs the clock signal CLK1 which is inputted to the input terminal IN1 to the output terminal OUT1 and outputs the clock signal CLK2 which is inputted to the input terminal IN2 to the output terminal OUT2. In the present embodiments, it is assumed that the signals outputted to the output terminal OUT1 and OUT2 have the phase relations as indicated in FIG. 4A. The phase difference detection circuit 23 of the delay difference adjustment circuit 12 detects how much the phase of the signal to output terminal OUT1 is advanced as compared with the one to the output terminal OUT2. The phase difference holding circuit 24 holds the results detected by the phase difference detection circuit 23 before the clock signals CLK1 and CLK2 are exchanged which the phase difference detection 23 outputs. In this case, since the phase difference hold circuit 24 yet holds only the detection results before the exchange of the transmission line of the clock signals CLK1 and CLK2, the comparator control circuit 26 inhibits the phase difference comparator circuit 25 from outputting the signal which directs to count up, count down or hold the counted value to the counter 28, the counter hold circuit 29 and the reset direction circuit 30. Consequently, the counted value of the counter 28 is unchanged. The counter hold circuit 29 does not direct the counter 28 to hold the counted value, and the reset indication circuit 30 does not reset the held value of the phase delay holding circuit 24. The input switching indication circuit 27 detects that the phase difference hold circuit 24 holds only the results of the phase difference detection before the exchange of the clock signals CLK1 and CLK2 and directs the selector circuit 21 of the observed circuit 11 to exchange the clock signals CLK1 and CLK2 by changing the value of the selector signal S11 to "1"

Referring to FIG. 2, as a result of the selector signal S11 becoming "1", the selector circuit 21 exchange the clock signals CLK1 and CLK2 and output them. In this manner, the clock signal CLK1 is outputted from the output port PORT2 and is sent out to IN2 of the delay difference adjustment circuit 12 via the cable 17b. The clock signal CLK2 is outputted from the output port PORT1 and is sent out to IN1 of the delay difference adjustment circuit 12 via the cable 17a.

Figure 4B:
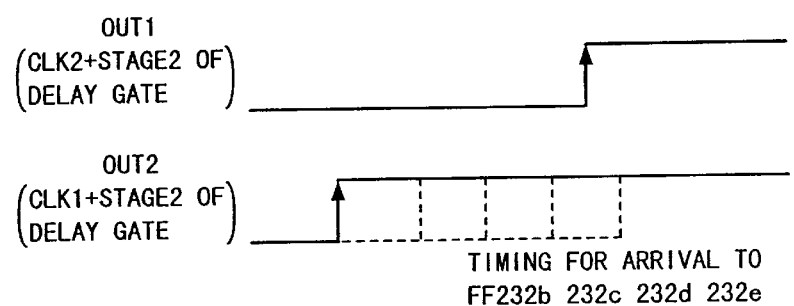

Referring to FIG. 3, the delay difference adjustment circuit 12 outputs the clock signal CLK2 inputted from IN1 to the output terminal OUT1, and outputs the clock signal CLK1 inputted from IN2 to the output terminal OUT2. Thereupon, if the delay of the cable 17a provided between the PORT1 of the observed circuit 11 and the input terminal IN1 of the delay difference adjustment circuit 12 is smaller than the delay of the cable 17b provided between the PORT2 of the observed circuit 11 and the input terminal IN2 of the delay difference adjustment circuit 12, the signals outputted to the output terminal OUT1 and OUT2 have the phase relations as indicated in FIG. 4B. The phase difference detection circuit 23 detects how much the phase of the signal to the output terminal OUT2 is advanced as compared with the one to the output terminal OUT1. The phase difference hold circuit 24 holds the detection results after the exchange of the clock signals CLK1 and CLK2 which the phase difference detection circuit 23 outputs. Then, the comparator control circuit 26 detects that the phase difference hold circuit 24 holds both the results of the phase difference detection before and after the exchange of the clock signals CLK1 and CLK2, and let the phase difference comparison circuit 25 output the comparison results. In this manner, the signals which directs count up, count down or hold the counted value are inputted to the counter 28. The counter 28 varies the counted value, whereby the value of the delay amount adjustment signal S12 increase or decrease by one stage. Also, the counter hold circuit 29 detects that the phase difference before and after the exchange of the clock signals CLK1 and CLK2 are not equal by using the results of the phase difference comparison which the phase difference comparison circuit 25 outputs, and neither directs the counter 28 to hold the counted value nor inhibits the phase difference hold circuit 24 clear the holding value. Since the comparison results of the phase difference before and after the exchange of the clock signals CLK1 and CLK2 outputted from the phase difference comparison circuit 25 are not equal, and moreover, since the counter hold circuit 29 does not inhibit the phase difference hold circuit 24 from clearing the holding value, the reset direction circuit 30 sets a reset signal R4 to "0". The entire holding values of the phase difference hold circuit 24 are cleared.

Figure 4C:
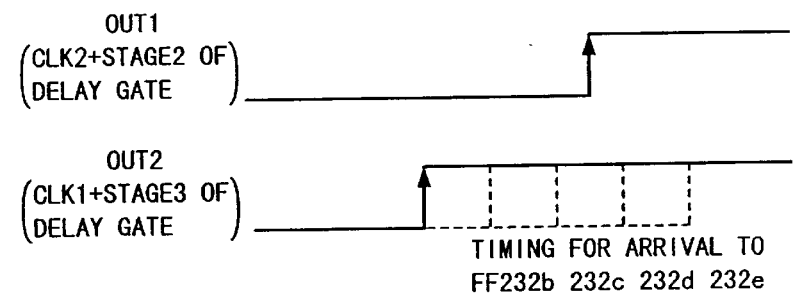

Here, since the entire holding values of the phase difference hold circuit 24 are cleared, the comparator control circuit 26 inhibits the phase difference comparison circuit 25 from outputting the results of the phase difference comparison. Consequently, the count value of the counter 28 does not vary, the counter hold circuit 29 does not direct the counter 28 to hold the counted value, the reset direction circuit 30 stops clearing the holding value of the phase difference hold circuit 24 by setting the value of the reset signal R4 to "1". The delay amount adjustment circuit 22 adjusts the delay amount of the clock signal CLK1 in accordance with the delay amount adjustment signal S12 of which value has been varied. In the present embodiment, the value of the delay amount adjustment signal S12 increase by one, the three stages of delay gate is imposed on the clock singal CLK1. Since the selector direction circuit 27 keeps the value of the selector signal S1 unchanged, i. e., "1", the signals outputted to the output terminals OUT1 and OUT2 have the phase relation as indicated in FIG. 4C. For this reason, the phase difference detection circuit 23 detects how much the phase of the signal to the output terminal OUT2 is advanced as compared with the one to the output terminal OUT1, and the phase difference hold circuit 24 holds the phase detection result detected by the phase difference ditection circuit 23 The phase difference hold circuit 24 holds only one result detected by the phase difference detection circuit 23 at this time. Therefore, the comparator control circuit 26 inhibits the phase difference comparison circuit 25 from outputting the signal which directs to count up, count down or hold the counted value to the counter 28. For this reason, the counter value of the counter 28 does not vary, the counter hold circuit 29 does not direct the counter 28 to hold the counted value, and the reset direction circuit 30 does not reset the holding value of the phase difference hold circuit 24. The selector direction circuit 27 detects that the phase difference hold circuit 24 holds only the results of the phase difference detection, to exchange the clock signals CLK1 and CLK2 by changing the value of the input switch direction signal S11 to "0", and directs the selector circuit 21 of the observed circuit 11.

Referring to FIG. 2, as a result of the selector signal S11 becoming "0", the selector circuit 21 exchanges the clock signals CLK1 and CLK2 once again. The clock signal CLK1 is inputted to the input terminal IN1 of the delay difference adjustment circuit 12 from the output port PORT1 via the cable 17a. The clock signal CLK2 is inputted to the input terminal IN2 from the output port PORT2 via the cable 17b.

Figure 4D:
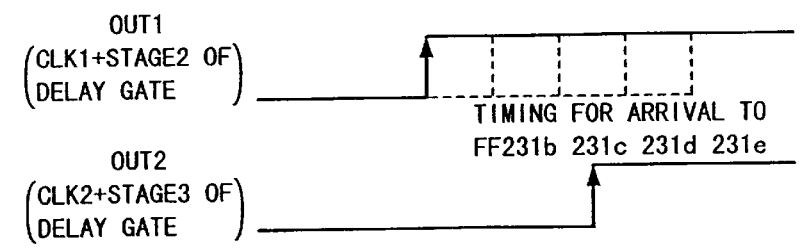
Figure 5:
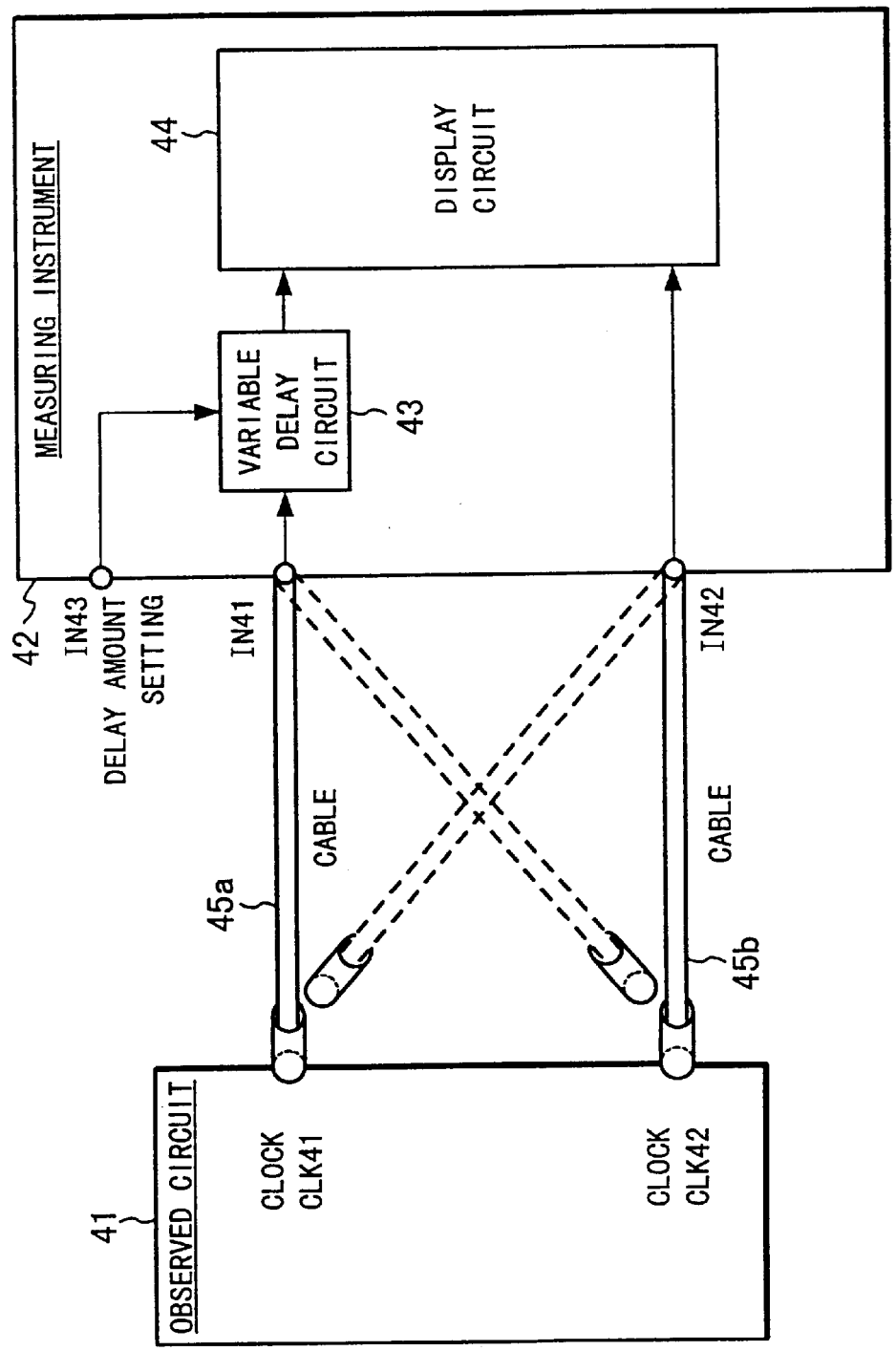
FIG. 5 shows the configuration of the conventional measuring instrument which adjusts the delay difference.

Referring to FIG. 3, in the delay difference adjustment circuit 12, the clock signal CLK1 inputted from the input terminal IN1 is outputted to the output terminal OUT1, and the clock signal CLK2 inputted from the input terminal IN2 is outputted to the output terminal OUT2. The signal waveforms outputted to the output terminals OUT1 and OUT2 have the phase relation as indicated in FIG. 4D. The phase difference detection circuit 23 detects how much the phase of the signal outputted to the output terminal OUT1 is advanced as compared with the one outputted to the output terminal OUT2. The phase difference hold circuit 24 holds the phase detection result detected by the phase difference detection circuit 23. At this time, the phase difference hold circuit holds two phase detection results correspond to two combination made by two clock signals CLK1 and CLK2 and cables 17. Therefore, the comparator control circuit 26 detects that the phase difference hold circuit 24 holds two phase difference detection results and let the phase difference comparator circuit 25 output the comparison results of the phase difference. In this case, since both of the two phase differences are equal or substantially equal, the counter 28 does not vary the count value, i.e., the value of the delay amount adjustment signal S12 does not vary. The counter hold circuit 29 directs the counter 28 to hold the counted value, and the reset direction circuit 30 inhibits the phase difference hold circuit 24 from clearing the holding value. Therefore, the reset direction circuit 30 does not set the value of the reset signal R4 to "0" and does not clear the holding value of the phase difference hold circuit 24. From the above, the delay difference of the two cables 17a and 17b are automatically adjusted without manual operation, thereby the true phase between the clock signals CLK1 and CLK2 are compared by the circuit 13. Therefore, the phase adjustment circuits 15 or 16 automatically adjusts the delay amounts of the clock signals by using the results of the phase comparison of phase comparison circuit 13.

Next, the operation of the delay adjustment circuit 12 will be described in detail.

Referring to FIG. 2, when the input switch direction signal S11 is "0", in the observed circuit 11, the selector 21a of the selector circuit 21 outputs the clock signal CLK1 to port PORT1 and supplies it to the two-stage delay gate 22a of the delay amount adjustment circuit 22 via the cable 17a and the input terminal IN1. The selector 21b outputs the clock signal CLK2 to the output port PORT2 and supplies it to the variable delay gate 22b via the cable 17b and the input terminal IN2.

Referring to FIG. 3, in the delay amount adjustment circuit 22, when the initial value of the two-bit delay adjustment signal S12 is set to "01", since a selector 22c selects the input IN2 which has passed through 2 stages of the variable delay gate 22b, both of the signals outputted to the outputs OUT1 and OUT2 pass through the two-stage delay gate and are delayed two delays from the signals outputted to the inputs IN1 and IN2, respectively. At this time, the signals outputted to the outputs OUT1 and OUT2 have the waveforms indicated in FIG. 4A, the value of each of the flip-flops inside the phase difference detection circuit 23 becomes "11000" for the FFs 231a–231e and "00000" for the FFs 232a–232e. Furthermore, in the phase difference hold circuit 24, the FFs 241a–241d fetch "0100" and the FFs 242a–242d fetch "0000". From this, since the hold signal H17-1 becomes "1" and H17-2 becomes "0", FF241a–241d hold the values and the selector direction circuit 27 switches the selector signal S11 to "1". Furthermore, since the output of the comparator control circuit 26 remains as "0", the comparator 25c of the phase difference comparison circuit 25 is outputting all the signals u, e, and d as "0".

Referring to FIG. 2, as a result of the selector signal S11 being switched to "1", in the observed circuit 11, the selector 21a outputs the clock signal CLK2 to the output port PORT1 and supplies it to the two-stage delay gate 22a via the cable 17a and the input IN1. The selector 21b outputs the clock signal CLK1 to the output port PORT2 and supplies it to the variable delay gate 22b via the cable 17b and the input IN2.

Referring to FIG. 3, in the delay amount adjustment circuit 22, since the delay amount adjustment signal S12 is "01", both of the signals outputted to the output ports OUT1 and OUT2 pass through the two stages of the delay gate and are delayed two delays from the signals inputted from the inputs IN1 and IN2, respectively. At this time, if there is no or substantially no delay difference at all between cables 17, the FFs 232a–232e become "11000" in a manner similar to that when the input switch direction signal S11 was "0" as described above, and furthermore, FF242a–242d ought to be "0100". However, for example, if the delay of the cable 17a is slightly smaller than the delay of the cable 17b, the signals outputted to the outputs OUT1 and OUT2 have waveforms as indicated in FIG. 4B. In this case, the values of the FFs 232a–232e of the phase difference detection circuit 23 become "11110" and consequently the FFs 242a–242d of the phase difference hold circuit 24 become "0001". As a result of this, since the hold signal H17-2 becomes "1", the FFs 232a–232e hold the values and the comparator control circuit 26 sets the output to "1". The comparator 25c compares the output values of the encoders 25a and 25b because both the hold signals H17-1 and H17-2 are "1". In this time, the output of the encoder 25a is "10" and the output of the encoder 25b is "100", the signals u becomes "1", signal e becomes "01", and signal d becomes "0". Consequently, the counter 28 counts up only by "1", and the delay amount adjustment signal S12 becomes "10". Also, the reset direction circuit 30 switches the reset direction signal R4 from "1" to "0" and clears the hold value of the FFs 241a–241d and the FFs 242a–242d. Furthermore, since the comparator control circuit 26 sets the output to "0", all the output signals u, e, and d become "0", and the reset direction signal R4 returns to "1".

At this stage, a series of operations starting with the phase difference detection is executed once again. Referring to FIG. 2, since the input switch direction signal S11 remains unchanged at "1", the selector 21a outputs the clock signal CLK2 to the output port PORT1 and supplies it to a two-stage gate 22a via the cable 17a and the input IN1. The selector 21b outputs the clock signal CLK1 to the output port PORT2 and supplies it to a variable delay gate 22b via the cable 17b and the input IN2.

Referring to FIG. 3, since the delay amount adjustment signal S12 has switched to "10", while the clock signal CLK2 outputted to the output OUT1 remains passing through the two stages of the delay gate, the clock signal CLK1 outputted to the output OUT2 pass through the three stages of the delay gate and is delayed three delays from the signal CLK1 inputted from the input IN2. In other words, the signals outputted to the output OUT1 and output OUT2 have the waveforms as indicated in FIG. 4C. Consequently, in the phase difference detection circuit 23, the FFs 231a–231e become "00000" and the FFs 232a–232e become "11100". In the phase difference hold circuit 24, the FFs 241a–241d become "00000" and the FFs 242a–242d become "0010". From this, since the hold signal H17-1 becomes "0", the hold signal H17-2 becomes "1", and the FFs 242a–242d only hold the values. The selector direction circuit 27 switches the selector signal S11 to "0". The output of the comparator control circuit 26 remains at "0".

Referring to FIG. 2, in the observed circuit 11, according to the selector signal S11 having switched to "0", the selector 21a outputs the clock signal CLK1 to the output port PORT1 and supplies it to the two-stage delay gate 22a via the cable 17a and the input IN1. The selector 21b outputs the clock signal CLK2 to the output port PORT2 and supplies it to the variable delay gate 22b via the cable 17b and the input IN2.

Referring to FIG. 3, in the delay amount adjustment circuit 22, since the delay amount adjustment signal S12 is still "10", the clock signal CLK1 outputted to the output OUT1 pass through the two stages of the delay gate and is delayed two delays from the signal CLK1 inputted from the input IN1. The clock signal CLK2 outputted to the output OUT2 pass through the three stages of the delay gate and is delayed three delays from the signal CLK2 inputted from the output OUT2. At this time, the signals outputted to the output OUT1 and OUT2 have the waveforms indicated in FIG. 4D. Consequently, in the phase difference detection circuit 23, the FFs 2331a–231e become "11100" and, in the phase difference hold circuit 24, the FFs 241a–241d become "0010". As a result of this, since the hold signal H17-1 becomes "1", the FFs 241a–241d hold the values, and since the comparator control circuit 26 sets the output of the encoder 25a to "01", the comparator 25c compares the output "01" of the encoder 25a and the output "01" of the encoder 25b. Since the values are equal, the signal u becomes "0", the signal e "1", and the signal d becomes "0", and the counter hold circuit 29 directs the counter 28 to hold its counted value.

On the other hand, if each of the delay amount of each of the delay gates of the delay amount adjustment circuit 22 and the phase difference detection circuit 23 have variations, there is some possibility that the outputs of the encoder 25a and encoder 25b are not equal even though the counter 28 may vary the value of the delay amount adjustment signal S12 and switches the number of stages of the variable delay gate 22b. In this case, the output of the comparator 25c repeatedly changes between u=1, d=0 and u=0, d=1. Therefore, the counter hold circuit 29 directs the counter 28 to hold the counted value and directs the reset direction circuit 30 to holds the reset signal R4 at "1", at the time when each of the output signals u and d of the comparator 25c has switched from "0" to "1" at least once. As a result of this, the adjustment of delay differences between the two cables is completed without requiring manual operations such as visual observation of the waveforms, exchange of cables or operation of the measuring instruments, and the phase comparison circuit 13 makes comparison of true phases of the clock signal CLK1 and the clock signal CLK2. Consequently, the phase adjustment circuits 15 and 16 automatically adjust the delay amount based on the results of the phase comparison of the phase comparison circuit 13, i. e., they adjust phases of the clocks fully automatically.

In the present embodiments, the selector circuit 21 is provided within the observed circuit 11, however, the connection switching of the cables 17a and 17b may also be performed through manual means without providing the selector circuit 21. In this case, it is not absolutely necessary that the two clock signals be taken out of a single card or part, they may be taken out of two cards or parts which are mutually different. More specifically, the clock signal CLK1 is taken out of the first card or part, and the signal clock CLK2 is taken out of the second card or part.

While this invention has been described in conjunction with the preferred embodiments thereof, it will now readily be possible for those skilled in the art to put this invention into practice in various other manners.

What is claimed is:

1. A circuit for adjusting the difference between delays of a first and a second signal line through which a first and a second signal are transmitted, said circuit comprising:

an adjustment circuit for receiving the first and the second signal through said first and said second signal line, and for delaying the first and the second signal by desired delay;

a detection circuit for receiving the first and the second signal from said adjustment circuit, and for detecting a phase difference between these signals;

a holding circuit for holding a first phase difference detected by said detection circuit when the first and the second signal transmit said first and said second signal line, respectively, and for holding a second phase difference detected by said detection circuit when the first and the second signal transmit said second and said first signal line, respectively;

a comparison circuit for comparing said first and said second phase difference; and a counter for counting in response to the comparison result of said comparison circuit and for setting said desired delay of said adjustment circuit.

2. The circuit as claimed in claim 1, further comprising:
   a counter hold circuit for directing said counter to hold the counted value when said first and said second phase difference compared by said comparison circuit are equal.

3. The circuit as claimed in claim 1, further comprising:
   a reset direction circuit for directing said holding circuit to clear said first and said second phase difference held therein, when said first and said second phase difference compared by said comparison circuit are not equal.

4. The circuit as claimed in claim 1, further comprising:
   a inhibition circuit for inhibiting said comparison circuit from outputting said comparison result to said counter, unless said holding circuit holds both said first and said second phase difference.

5. The circuit as claimed in claim 1, further comprising:
   an exchanging circuit for exchanging the first and the second signal and for outputting the respective signals to the desired lines of said first and said second signal line.

6. The circuit as claimed in claim 5, further comprising:
   a direction circuit for directing said exchanging circuit to exchange the first and the second signal, when said holding circuit holds either said first or said second phase difference detected by said detection circuit.

7. A device for adjusting the difference between delays of at least two signal lines through which at least two signals are transmitted from an observed circuit, said device comprising:

an exchange circuit for exchanging combination of said signals and said signal lines, and for outputting said signals to the corresponding signal lines in accordance with said combination, said exchange circuit being provided in the observed circuit;

an adjustment circuit for receiving said signals from said exchange circuit through said signal lines, and for delaying said signals by a desired delay before and after the exchange of said combination;

a detection circuit for receiving said signals from said adjustment circuit and for detecting the phase differences between these signals before and after the exchange;

a holding circuit for holding the phase differences between said signals detected by said detection circuit before and after the exchange;

a comparison circuit for comparing the phase differences held by said holding circuit, when both of the phase differences of said signals before and after the exchange; and a counter for counting in accordance with the comparison results of said comparison circuit, and for setting said desired delay of said adjustment circuit.

8. A phase adjuster, comprising:

a first adjustment circuit for adjusting a difference between delays between first and second signal lines through which said first and second signals are transmitted from signal sources;

a comparison circuit for comparing phases of said first and second signals transmitted through said first and second signal lines whose difference between delays is adjusted by said first adjustment circuit; and a second adjustment circuit for adjusting the delay of at least one of said first and second signals in accordance with comparison results of said comparison circuit, wherein said first adjustment circuit comprises:
   an adjustment circuit for receiving said first and second signals through said first and second signal lines, and for delaying said first and second signals by a desired delay;

a detection circuit for receiving said first and second signal from said adjustment circuit, and for detecting a phase difference between these signals;

a holding circuit for holding a first phase difference detected by said detection circuit when said first and second signals transmit said first and second signal lines, respectively, and for holding a second phase difference detected by said detection circuit when first and second signals transmit said second and first signal lines, respectively;

a comparison circuit for comparing said first and second phase differences; and a counter for counting in response to the comparison result outputted from said comparison circuit and for setting said desired delay of said adjustment circuit.

* * * * *